(12) United States Patent  
Park (10) Patent No.: US 6,219,397 B1
(45) Date of Patent: Apr. 17, 2001

(54) LOW PHASE NOISE CMOS FRACTIONAL-N FREQUENCY SYNTHESIZER FOR WIRELESS COMMUNICATIONS

(75) Inventor: Byeong-Ha Park, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/045,192

(22) Filed: Mar. 20, 1998

(51) Int. Cl.$^7$ ........................................ H03D 3/24
(52) U.S. Cl. ................................. 375/376; 327/156
(58) Field of Search .............................. 375/376, 373; 331/1 A; 332/127, 100; 327/144, 145, 147, 149, 150, 156, 158, 159

(56) References Cited

U.S. PATENT DOCUMENTS

| | | | |
|---|---|---|---|
| 4,800,342 | * 1/1989 | Jackson | 331/1 A |
| 4,810,977 | * 3/1989 | Flugstad et al. | 332/127 |
| 4,816,774 | * 3/1989 | Martin | 331/1 A |
| 5,055,800 | * 10/1991 | Black et al. | 331/1 A |
| 5,055,802 | * 10/1991 | Hietala et al. | 331/16 |
| 5,727,038 | * 3/1998 | May et al. | 375/376 |
| 5,821,816 | * 10/1998 | Patterson | 331/1 A |
| 5,825,253 | * 10/1998 | Mathe et al. | 331/18 |
| 5,889,443 | * 3/1999 | Jorgenson | 332/100 |

OTHER PUBLICATIONS

Simon Haykin; Communication Systems; John Wiley & Sons; New York; 1994, pp. 173–174.*

Miller, Brian and Conley, Robert J., *A Multiple Modulator Fractional Divider*, IEEE Transactions on Instrumentation and Measurement, vol. 40, pp. 578–583, Jun. 1991.

* cited by examiner

Primary Examiner—Don N. Vo
(74) Attorney, Agent, or Firm—Marger Johnson & McCollom, P.C.

(57) ABSTRACT

A PLL-based CMOS fractional-N frequency synthesizer, which has an on-chip LC Voltage Controlled Oscillator. A higher-order discrete sigma-delta modulator is used in the fractional-N frequency synthesizer resulting in a strong attention at low frequencies for quantization noise. The synthesizer employs a noise shaping method to suppress fractional spurs using the high-order sigma-delta modulator.

16 Claims, 7 Drawing Sheets

LOW PHASE NOISE CMOS FRACTIONAL-N FREQUENCY SYNTHESIZER FOR WIRELESS COMMUNICATIONS

FIELD OF THE INVENTION

The present invention relates to a frequency synthesizer and, more particularly to a PLL (Phase-Locked Loop)-based fractional-N frequency synthesizer for wireless communications.

BACKGROUND OF THE INVENTION

The recent rapid growth in demand for wireless communications services has been a strong motivation for designing more highly integrated RF ICs with low operating voltage, low power, and low cost, while meeting performance requirements for wireless systems. Scaled CMOS technologies can be more effectively utilized to improve the integration level of the RF transceivers and synthesizers, while resulting in further improvements in power dissipation and cost.

A frequency synthesizer, used to generate a local oscillator frequency, is one of the major building blocks for wireless communications devices. Since the synthesizer influences the performance of the overall wireless systems, it should have high performance, specifically low phase noise and low spurious tones or signals (hereinafter, referred as spurs). Modern wireless communications systems require frequency synthesizers to cover the frequency range from about 800 MHZ to 2.5 GHz.

A PLL-based synthesis technique offers high integration level, low power dissipation, small chip area, high reliability, and predictable performance. The comparison frequency in an integer-N PLL frequency synthesizer is equal to the channel frequency spacing. Thus, the integer-N frequency synthesizer with A small channel frequency spacing is not suitable for a system required fast frequency acquisition time because the loop bandwidth should be narrow enough to keep the system stable. Another drawback comes from the inverse relationship between the frequency spacing and in-band phase noise. As the frequency spacing decreases, the divide ratio of the programmable frequency divider for a given local oscillator frequency range must increase. The higher the divide ratio, the worse the phase noise inside the loop bandwidth close to the carrier frequency. The in-band phase noise is higher than the system noise floor by about an amount of 20logN, where N is the total divide ratio. The output spurs are also related to the loop bandwidth. Thus, trade-offs are needed in determining the loop bandwidth and loop performance.

A fractional-N frequency synthesis technique enables the use of reference frequencies larger than the channel frequency spacing (U. L. Rhode, *Digital PLL Frequency Synthesizers: Theory and Design*, Prentice-Hall, Englewood Cliffs, N.J., 1983.). This technique is able to considerably reduce the divide ratio N in the loop for the same frequency spacing as that in an integer-N synthesizer, while using the highest possible reference frequency. This technique has a significant beneficial effect on the in-band phase noise performance of the synthesized output. The possibility of using a higher reference frequency also opens up the way to a wider loop bandwidth, hence faster switching time. Using a reference frequency higher than the channel frequency spacing can reduce the reference spurs at the output. However, use of the fractional-N technique introduces periodic disturbances in the loop, resulting in large fractional spurs at all multiples of the offset frequency depending on the fractional data.

A noise shaping technique using a high-order sigma-delta modulator is used to suppress the fractional spurs. One example of the technique can be found in *A Multiple Modulator Fractional Divider*, by B. Miller and R. J. Conley (IEEE Transactions on Instrumentation and Measurement, vol. 40, pp. 578–583, June 1991.). The idea is to eliminate the low frequency phase error by rapidly switching the divide ratio between different ratios to eliminate the gradual phase error at the phase-frequency detector. By changing the divide ratio rapidly between different values, the phase error occurs in both polarities, positive as well as negative, and in an accelerated rate that explains the phenomena of high frequency noise push-up.

SUMMARY OF THE INVENTION

It is an object of the present invention to provide a frequency synthesizer which performs a higher order difference operation of the error produced by the quantizer and thus stronger attenuation at low frequencies for the quantization noise.

It is another object of the present invention to provide a frequency synthesizer having low phase noise and power consumption.

It is still another object of the present invention to provide a frequency synthesizer capable of quickly changing the output signal frequency, and decreasing the spurs of the output signal.

It is still another object of the present invention to provide a frequency synthesizer having simple enough in circuit structure to be integrated.

In order to attain the above objects, according to an aspect of the present invention, there is provided a PLL-based CMOS fractional-N frequency synthesizer, which has an on-chip VCO. A higher-order discrete sigma-delta modulator is used in the fractional-N frequency synthesizer. The synthesizer employs a noise shaping method to suppress fractional spurs using the high-order sigma-delta modulator.

According to an embodiment of this invention, a frequency synthesizer comprises a reference divider, an LC VCO, a multimodulus prescaler, a phase-frequency detecting circuit, a loop filter, 3rd-order sigma-delta modulator, and an output buffer. The reference divider divides an externally provided reference frequency data signal by a given divide ratio. The LC VCO generates an output signal of variable frequency in response to a frequency control voltage signal from the loop filter. The multimodulus prescaler selects one of multiple module in response to a scaling control data signal from the sigma-delta modulator, and scales down the output signal of the VCO by the selected modulus. The sigma-delta modulator generates the scaling control data signal in response to an externally provided frequency setting data signal. The phase-frequency detector detects the phase difference between the output signal of the reference divider and the output signal of the prescaler and generates a phase error signal. The phase error signal is provided to the VCO via the loop filter acting as a low-pass filter.

BRIEF DESCRIPTION OF THE DRAWINGS

A more complete appreciation of the present invention, and its advantages, will become readily apparent as described in the following detailed description when considered in conjunction with the accompanying drawings in which like reference symbols indicate the same or similar components, wherein.

DESCRIPTION OF THE PREFERRED EMBODIMENT

A low-phase-noise fractional-N CMOS frequency synthesizer with an integrated multimodulus prescaler is described. An embodiment of this invention has been fabricated in a 0.5 μm CMOS technology with three metal layers. The active chip area is 3.2 mm² and the total power dissipation is 43 mW at a 3.3 V supply voltage. In the following description, numerous specific details such as frequencies, the divide ratios, frequency setting data, bit size of the accumulator, voltages, inductance and capacitance are set forth in order to provide a thorough understanding of the present invention. It will be apparent, however, to one skilled in the art that the present invention may be practiced without these specific details. In other instances, well-known circuits are shown in block diagram form in order not to obscure the present invention.

A discrete first-order sigma-delta modulator can be implemented with an m-bit accumulator. The m-bit accumulator has m-bit input, a single output bit (carry-bit or MSB), and m-bit residue. The residue signal represents the quantization error in the output signal.

High-order cascaded sigma-delta modulators can be implemented using a discrete first-order modulator to provide higher performance than that of the first-order modulator (S. R. Norsworthy, R. Schreier, and G. C. Themes, *Delta-Sigma Data Converters: Theory, Design, and Simulation*, IEEE PRESS, 1997.). When multiple first-order modulator loops are cascaded to obtain a higher order modulator, the signal that is passed to the successive loop is the quantization error from the current loop. For an nth-order cascaded sigma-delta modulator, the modulator output can be expressed as:

$$Y(z)=F(z)+(1-z^{-1})^n Q_n(z) \quad (1)$$

where $F(z)$ is the z-transform of the input and $Q_n(z)$ is the z-transform of the quantization from the nth sigma-delta loop. From equation (1), it is concluded that modulators with more than one sigma-delta loop, such as a third-order sigma-delta modulator, perform a higher order difference operation of the error produced by the quantizer and thus stronger attenuation at low frequencies for the quantization noise.

This higher-order discrete sigma-delta modulator is used in a fractional-N frequency synthesizer according to the present invention. The architecture of a fractional-N frequency synthesizer according to an embodiment of the invention is shown in FIG. 1.

According to this embodiment, the CMOS synthesizer operates in the frequency band of 860 MHZ to 1 GHz and has 64 programmable channels with a channel spacing of $F_1/64$ (where $F_1$ is the comparison frequency of the phase-frequency detector), and the phase noise of −110 dBc/Hz at a 200 KHz off-set frequency away from a center frequency of 980 MHZ. The reference sideband spurs are −73.7 dBc. The synthesizer operates over a range of 2.7 V to 4.5 V power supply voltage and consumes 43 mW, including the VCO buffer power dissipation, from a 3.3 V supply voltage. It has been implemented using a 0.5 μm CMOS process with three metal layers. In addition, the design issues used to achieve simultaneous low power, low phase noise, and low sideband spurs will be described, and measurement results on the embodiment will be provided.

Figure 1:
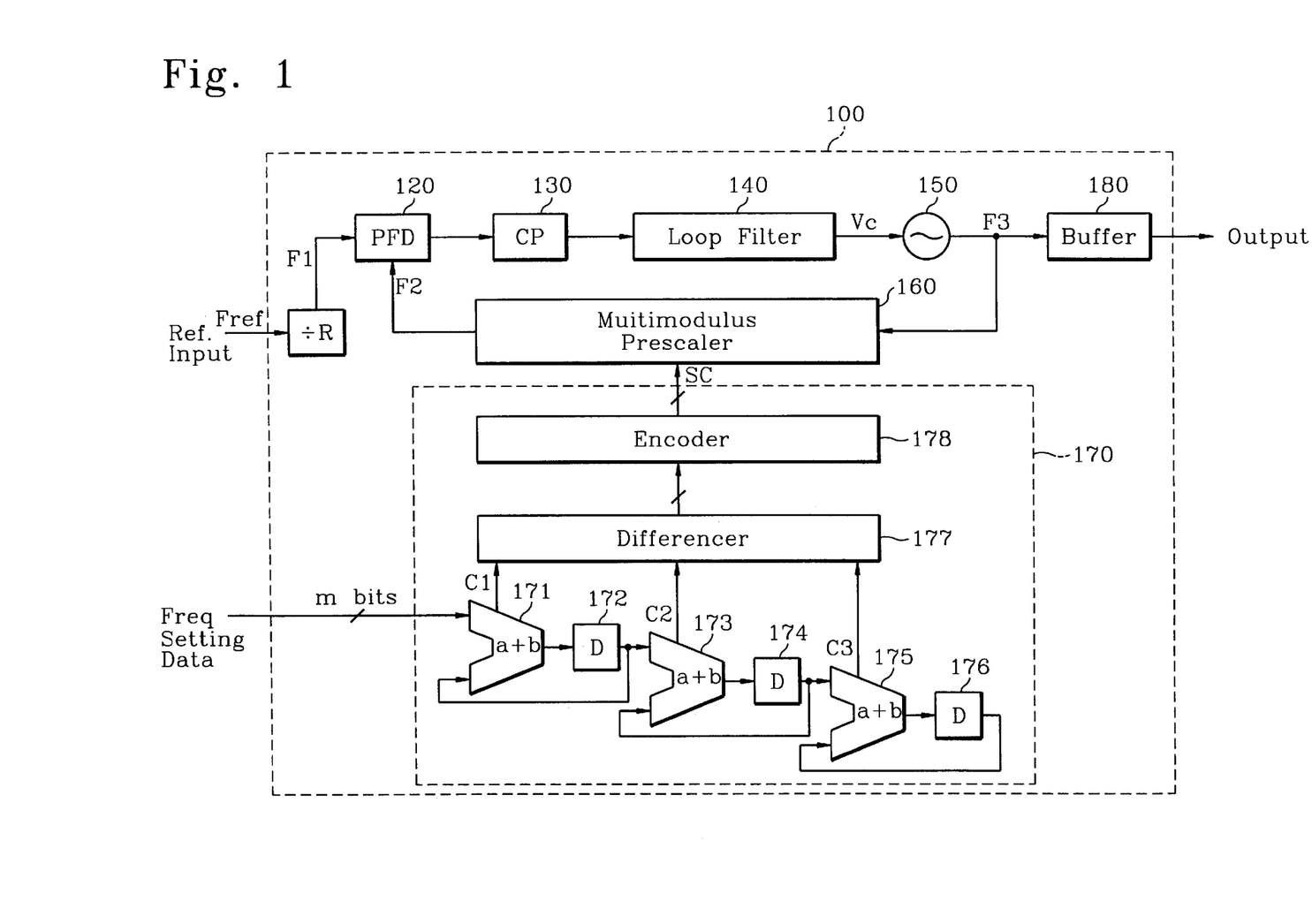
FIG. 1 is a block diagram of a fractional-N frequency synthesizer according to an embodiment of the present invention.

Referring to FIG. 1, the frequency synthesizer 100 includes a reference divider 110, a phase-frequency detector 120, a charge pump 130, a loop filter 140, a voltage-controlled oscillator (VCO) 150, a multimodulus prescaler 160, a third-order sigma-delta modulator 170, and a RF output buffer 180. The reference divider 110 divides an externally provided reference frequency data signal by a given divide ratio R. The phase-frequency detector circuit consisting of a digital phase-frequency detector 120 and a charge pump 130 detects the phase difference between the output signal $F_1$ of the reference divider 120 and the output signal $F_2$ of the prescaler 160, and generates a phase error signal. The LC VCO 150 generates an output signal $F_3$ of variable frequency in response to a frequency control voltage signal Vc from the loop filter 140. The multimodulus prescaler 160 selects one of multiple module in response to a scaling control data signal SC from the sigma-delta modulator 170, and scales down the output signal $F_3$ of the VCO 150 by the selected modulus. The sigma-delta modulator 170 generates the scaling control data signal SC in response to an externally provided m-bit frequency setting data signal. The phase error signal is provided to the VCO via the loop filter 140. The phase-frequency detector (PFD) 120, charge pump 130, loop filter 140, VCO 150, and multimodulus prescaler 160 form a phase-locked loop (PLL), as well known.

The PFD 120 and charge pump 130 minimize the dead zone and result in improving spurious performance. The loop filter 140 acts as a low-pass filter. The sigma-delta modulator 170 has a three-stage accumulator block which comprises accumulators 171, 173 and 175, and delays 172, 174 and 176. The demodulator 170 further includes a differencer 177 and an encoder 178 for generating control signals for the multimodulus prescaler 160. Carry bit outputs (i.e., MSBs) C1 to C3 of the accumulators 171, 173 and 175 are provided to the differencer 177. The accumulators 171 and 173 each provide its residue signal to the next accumulator through a delay. The residue signal represents the quantization error in the output signal.

When the PLL is locked, the RF output frequency is:

$$f_o = \frac{1}{R}\left(N + \frac{k}{2^m}\right) F_{ref} \quad (2)$$

where R is the divide ratio of the reference divider 110, N is the integer part of the divide ratio of the multimodulus prescaler (or feedback frequency divider) 160, k is the frequency setting data which is externally applied, m is the bit size of each accumulator 171, 173 or 175, and $F_{ref}$ is the frequency of the external reference signal which is applied to the reference divider 110. The output frequency is varied in $(F_{ref}/R)(k/2^m)$ frequency resolution. For a given frequency resolution, the effective divide ratio can be reduced by choosing a higher comparison frequency, $F_1=F_{ref}/R$, than the frequency resolution, which reduces the in-band phase noise of the synthesized signal.

Figure 2:
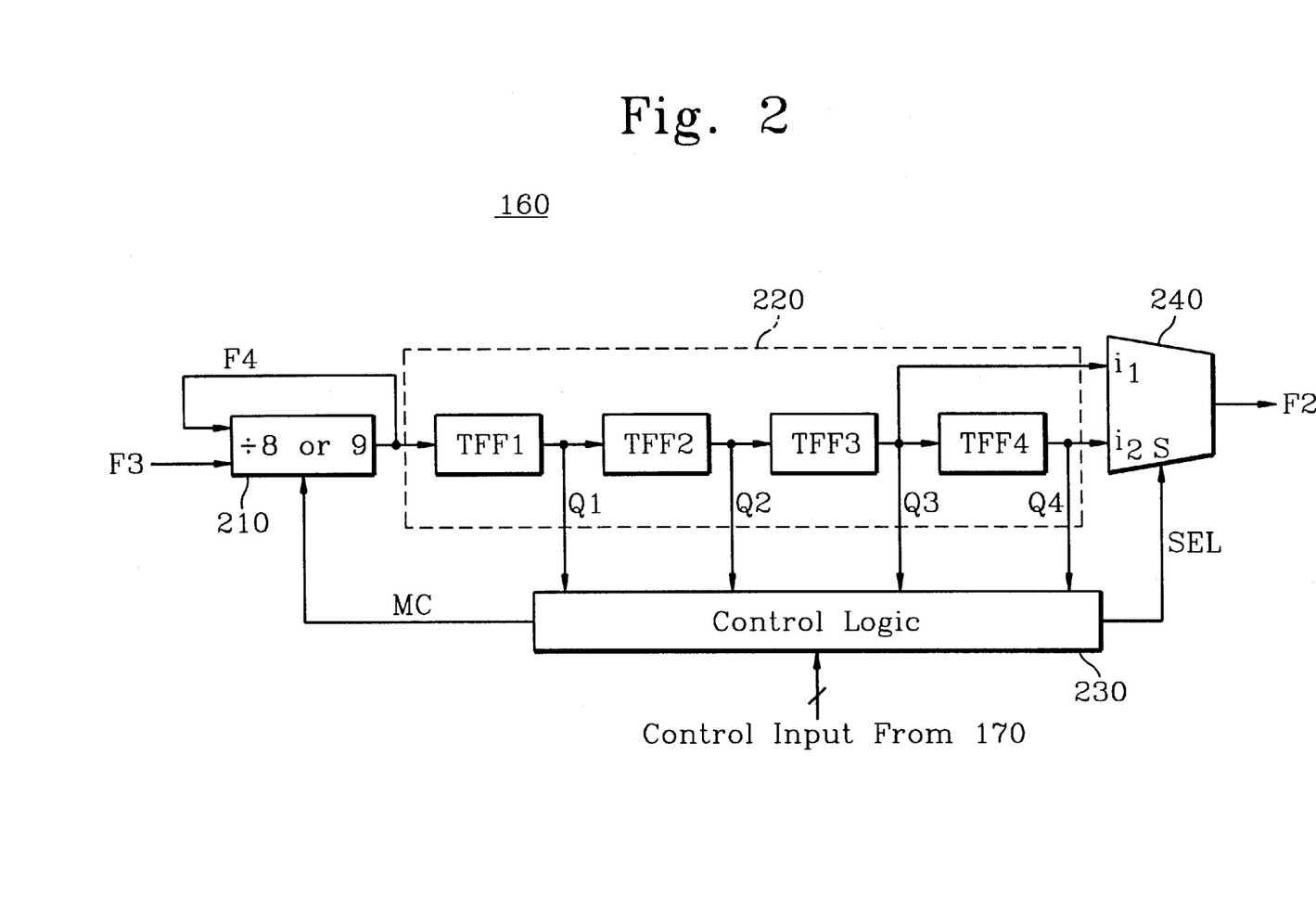
FIG. 2 is a circuit diagram showing a structural example of the multimodulus prescaler of FIG. 1.

FIG. 2 shows a structural example of the multimodulus prescaler 160 of FIG. 1. Referring to FIG. 2, the multimodulus prescaler 160, which has several divide ratios controlled by mode control input generated by the sigma-delta modulator 170 and is used in the fractional-N synthesizer 100 is designed to simplify the hardware required for the design of fractional-N frequency synthesis. The multimodulus prescaler 160 includes a dual modulus prescaler 210, a four-stage extender 220 comprises four T-type flip-flops, a control logic 230, and a two-input multiplexer 240 as shown in FIG. 2. The control logic 230 operates in response to the scaling control signal SC. The dual modulus prescaler 210 scales down the output signal of the LC VCO 150 of FIG. 1 by either one of two module 8 and 9 in response a mode control signal MC from the control logic 230. The extender extends an output signal of the dual modulus prescaler so as to generate output signals Q1 to Q4 under the control of the control logic 230. The multiplexer 240 selects one of the output signals Q3 and Q4 of the extender 220 and provides it to the PFD 120.

The divide ratio for the prescaler 160 is, for example, set to be N−6 to N+74, where N is equal to either 70 or 71, depending on the mode control input from the sigma-delta modulator 170. The dual modulus prescaler 210 has the divide ratio of either 8 or 9 in response to the control input MC from the control logic 230, and has two inputs, i.e., an input F3 applied from the VCO 150 and a feedback input F4 from its output.

Realization of a high-speed prescaler in mixed environment requires careful attention to certain aspects of the circuit design to contribute low noise to sensitive analog circuits such as VCO, which shares the same substrate with noisy circuits, and to the synthesized output signal. Current-mode logic (CML) instead of a static CMOS logic is used to implement the prescaler. The CML uses constant current source, which causes lower digital noise generation, and differential signals at both input and output, which reduces coupling noise from the supply line and substrate because the inherent differential circuit rejects the power supply and substrate noise.

Another issue of the prescaler design is reduction in power consumption at a given frequency range. Most power consumption in the prescaler occurs in the front-end synchronous divider because it is the part of the circuit operating at the maximum frequency of the input signal.

Figure 3:
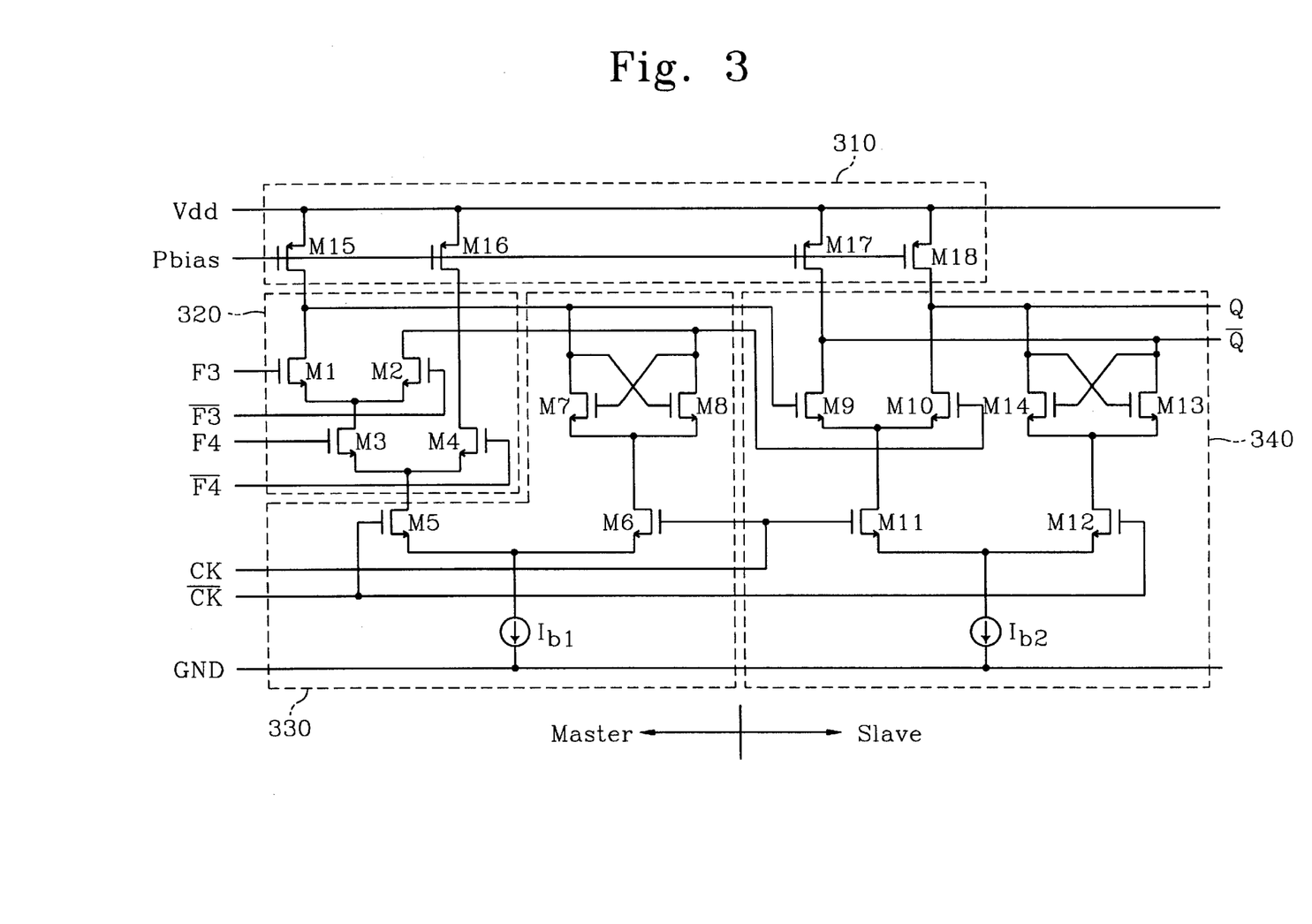
FIG. 3 is a detailed circuit diagram of an example of a D-type flip-flop which can be used in the dual modulus prescaler of FIG. 2.

In FIG. 3, there is shown a D-type flip-flop which is used in the dual modulus prescaler 210. The flip-flop is a rising edge triggered D-type flip-flop with an embedded NAND gate. The flip-flop is used in the front-end of the prescaler 210 to reduce power consumption. The embedded NAND gate 320 of the D type flip-flop is implemented by transistors $M_1$ to $M_4$ and has two inputs F3 and F4. In FIG. 3, reference numerals 310, 330 and 340 represent a current driver, a master latch and a slave latch, respectively. The master latch 330 comprises transistors $M_5$ to $M_8$, and the slave latch 340 comprises transistors $M_9$ to $M_{14}$.

Figure 4:
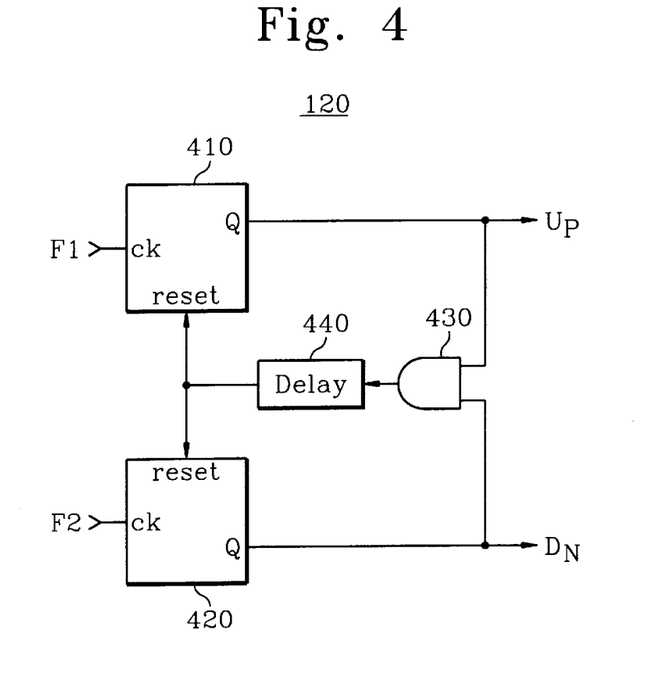
FIG. 4 is a circuit diagram of an example of the phase-frequency detector of FIG. 1.
Figure 5:
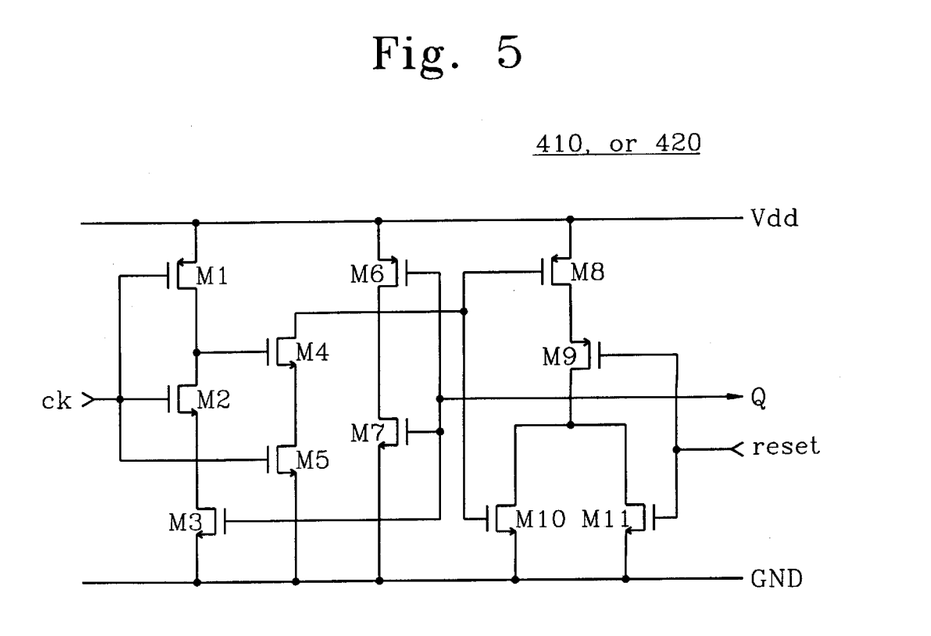
FIG. 5 is a detailed circuit diagram of an example of the D-type flip-flops used in the phase-frequency detector of FIG. 4.

FIG. 4 shows an example of the PFD 120 of FIG. 1. Referring to FIG. 4, the PFD 120 uses modified D-type flip-flops 410 and 420 with a small number of devices in signal path to increase speed and extra delay logics 430 and 440 to increase the reset delay, thus eliminating the dead zone. In the FIG. 4, the reference symbols $U_P$ and $D_N$ represent output terminals for controlling the charging and discharging of the charge pump 130, respectively. An example of the D-type flip-flops 410 and 420 used in the PFD 120 is shown in FIG. 5. The flip-flop comprises transistors $M_1$ to $M_{11}$.

Turning back to FIG. 1, the charge pump 130 is designed to keep mismatches between the sourcing and sinking currents, and mismatches in the sourcing and sinking switching time small for low sideband spurs in the synthesized output signal. The output stage of the charge pump 130 uses cascading to keep a high output impedance. The peak current of the charge pump 130 is designed to be 300 uA. The charge pump 130 has a voltage compliance of 300 mV from ether rail to minimize the required VCO tuning sensitivity, to cover wide frequency range, and to overcome process variations.

Figure 6:
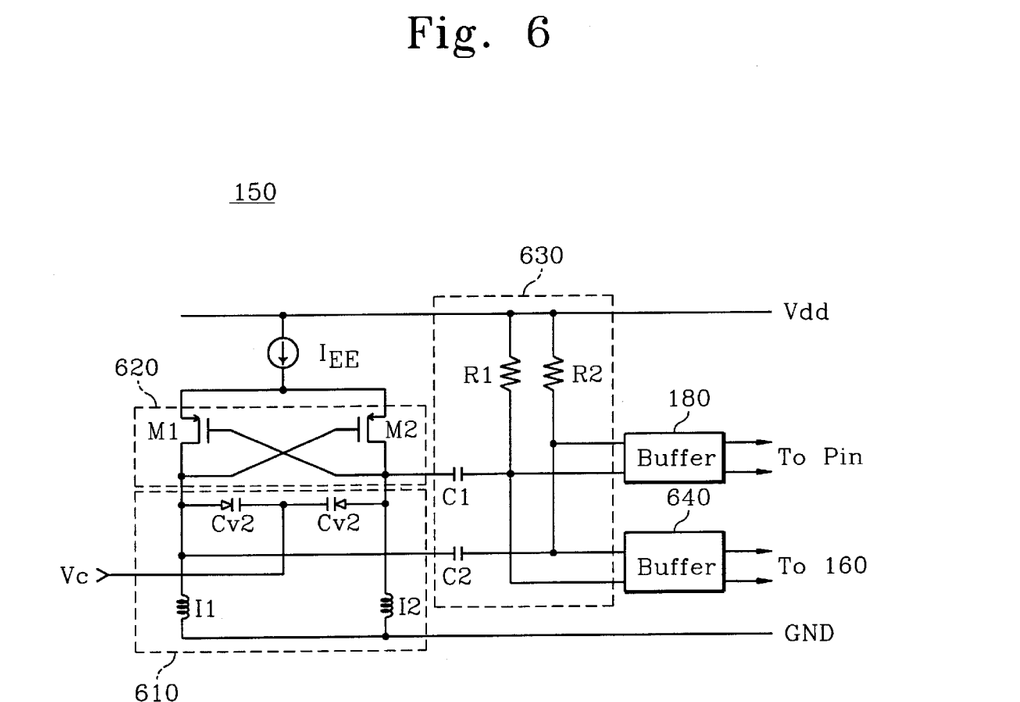
FIG. 6 is a detailed circuit diagram of an example of the VCO of FIG. 1.

Now referring to FIG. 6, there is shown an example of the VCO 150 of FIG. 1. A monolithic, fully differential, LC VCO with a single control input is used in the synthesizer according to this embodiment. The VCO 150 has an LC resonator 610, a differential pair 620, an AC coupling filter 630, and an output buffer 640.

The LC resonator 610 includes on-chip spiral inductors $I_1$ and $I_2$ and varactor diodes $C_{v1}$ and $C_{v2}$. The spiral inductors are implemented in metal 3 with a spacing of 2.1 μm and a trace width of 16 μm. The inductors have 5 turns and a 300 by 300 μm² outer size. Each inductor has a value of 7.5 nH and quality factor of about 8.5 at 930 MHZ. Varactors $C_{v1}$ and $C_{v2}$ are implemented by a p⁺ diffusion in an N-well. An interdigitating layout is used to decrease the series resistance, thus increasing the quality factor Q of the varactor.

The differential pair 620 has PMOS transistors $M_1$ and $M_2$ whose gates are cross-coupled to each other, and acts as a negative resistance for the LC resonator 610. PMOS transistors instead of NMOS transistors are used in the VCO core because PMOS has lower flicker noise and thermal noise than NMOS and is built in an N-well, thus having less substrate noise pick-up than its counterpart.

The fully differential architecture of the VCO 150 provides more power supply rejection as well as more common mode noise immunity compared to single-ended designs. Two buffers 180 and 640 are integrated to isolate the output of the VCO 150 from the next stage and result in improving VCO pulling.

The AC coupling filter 630 includes capacitors $C_1$ and C2 and resisters R1 and R2, and interfaces the VCO signals to the buffers 180 and 640. The resistors R1 and R2 should be large enough to minimize their loading effects on the VCO RF output.

Within inductance of 7.5 nH, the total capacitance must be about 3.7 pF to obtain an oscillation frequency of 950 MHZ. The capacitance of the LC resonator 610 is formed by the parasitic capacitance between the inductors and the substrate, the drain-bulk, gate-drain and gate-source capacitance of the transistors, the loading capacitance of the buffers, and a tunable p⁺/n-well junction capacitance. In order to achieve a large tuning range, the contribution of the tuning capacitor to the total capacitance must be as large as possible.

Figure 7:
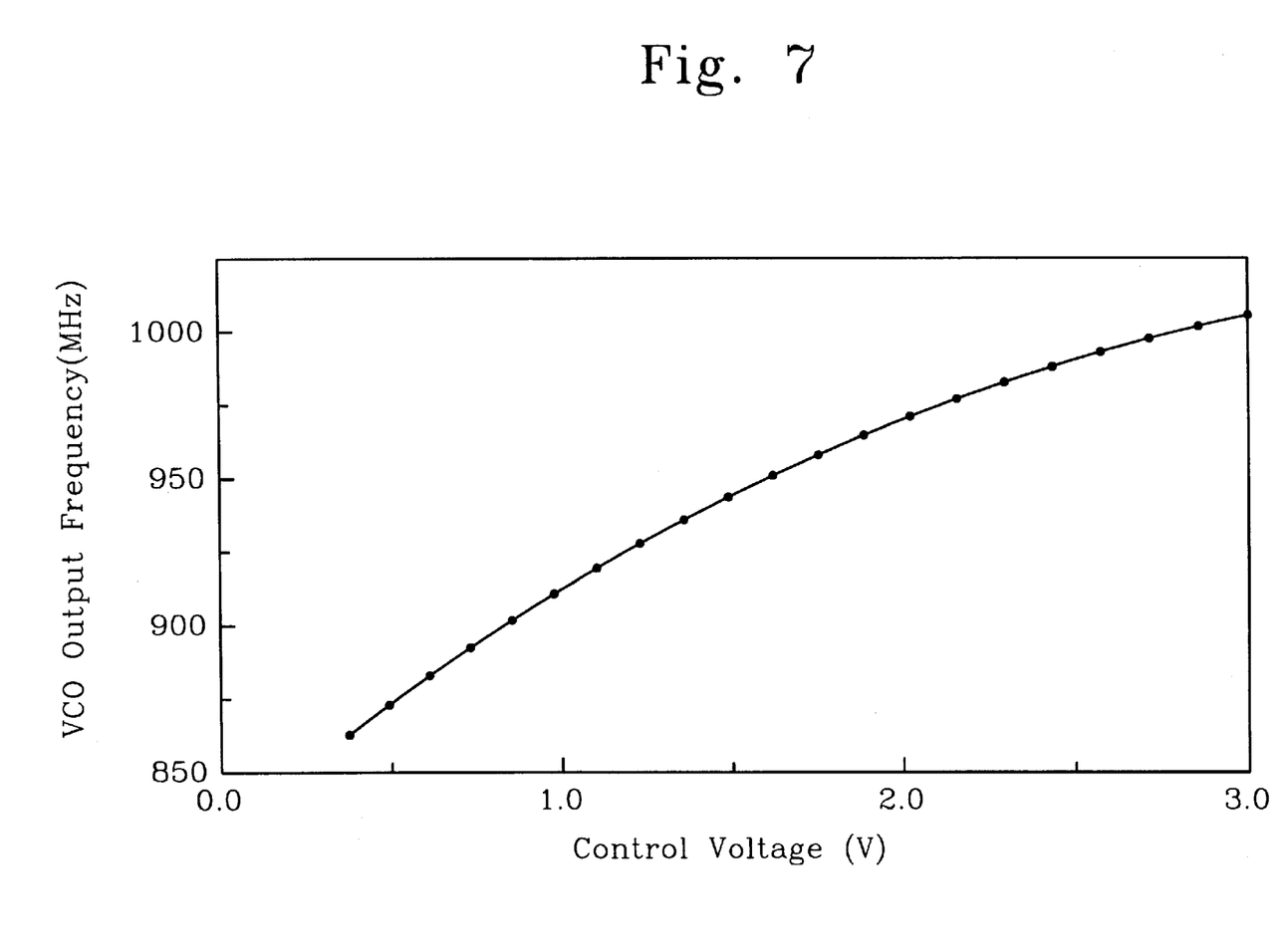
FIG. 7 is a diagram illustrating the tuning characteristics of the VCO of FIG. 5.

FIG. 7 is a graphical illustration showing the measured output frequency versus control voltage of the integrated LC VCO 150. The tuning range is 865 MHZ to 1006 MHZ with a control voltage of 0.4 V to 3.0 V at a 3.3 V power supply. Due to the nonlinearity in the varactor diode capacitance to voltage ratio, the VCO sensitivity is higher at lower frequencies (less reverse bias voltage across the varactor diode).

Figure 8:
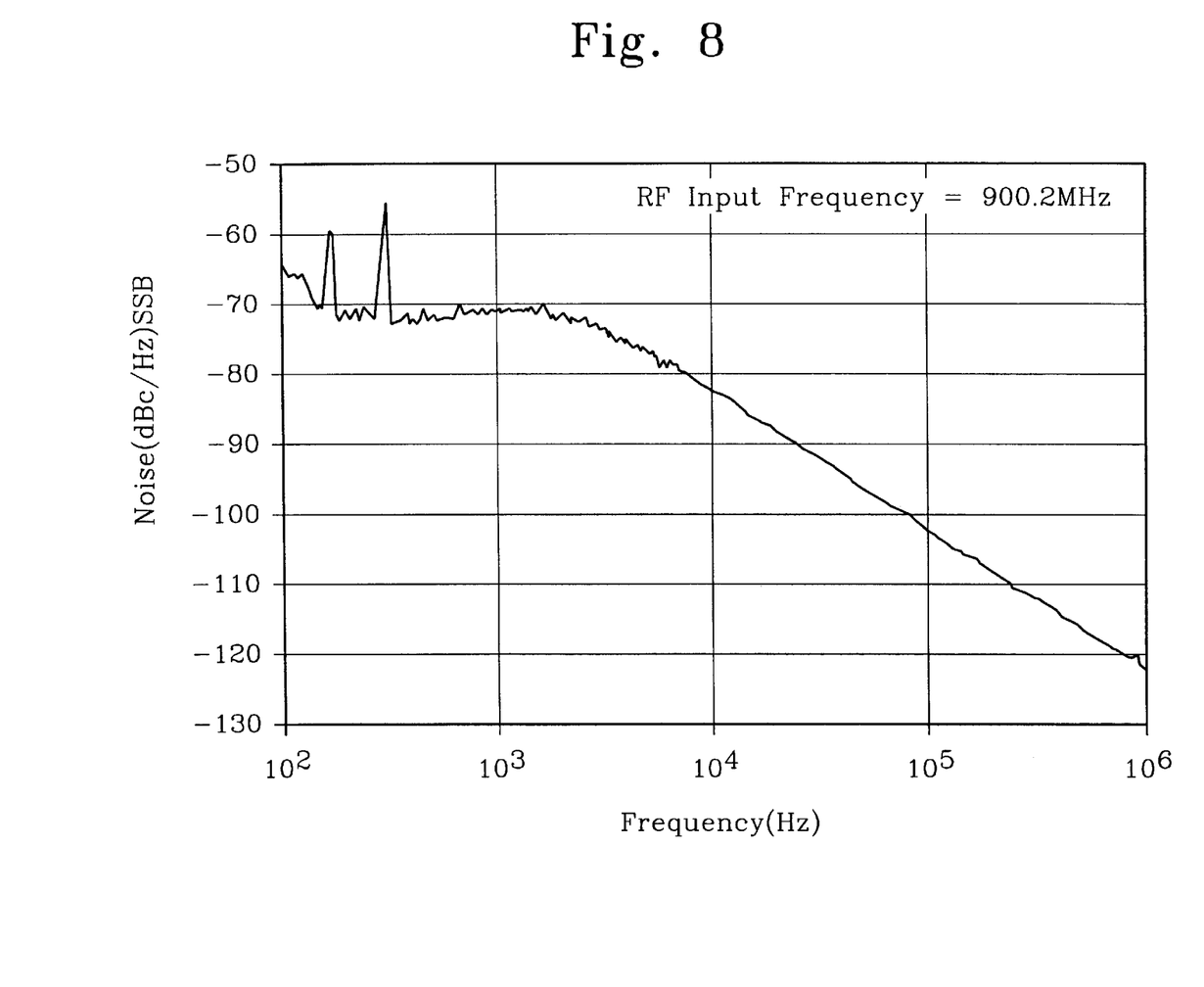
FIG. 8 is a graphical illustration of the single side band phase noise of the synthesizer of FIG. 1.

FIG. 8 shows the single sideband phase noise measured using a RDL Phase Noise Analyzer with a loop bandwidth of 6 MHZ. The frequency setting input k is programmed to be 1, which gives the carrier frequency of $f_0$=14 MHZ (70+1/64), resulting in a carrier frequency of 980.219 MHZ. The measured phase noise is −110 dBc/Hz at a 200 KHz offset and −118 dBc/Hz at a 600 KHz offset.

According to this embodiment, the measured sideband spurs are less than −73.5 dBc with a bandwidth of 20 KHz. The main sources of the spurs are the leakage current in the varactor diode, the mismatches between the sourcing and sinking currents of the charge pump, and the switching mismatches in the charge pump. Also, the spur level is dependent on the PLL bandwidth. Although the level of the reference spurs are mostly related to the performance of the synthesizer circuits, the spur level can be degraded by a leakage signal coupling through the substrate. In accordance with the measurements, the reference sideband spurs are limited by the substrate coupling. That means that the spurs can not be reduced by decreasing the loop bandwidth if the loop bandwidth is less than 40 KHz. Thus, the reduction in signal coupling via the substrate is important to get lower side-band spurs. Table 1 shows the summary of the measurement results of the embodiment.

TABLE 1

| Items |
|---|
| Measured Results |
| Phase noise at 200 KHz |
| −110 dBc/Hz |
| Frequency range |
| 865–1005 MHZ |
| Reference Spurs |
| Less than −73.5 dBc |
| Fractional Spurs |
| Less than −66 dBc |
| Second Harmonic |
| −24 dBc |
| Power dissipation at Vdd = 3.3V |
| Total: 43 mW |

Although the preferred embodiment of the present invention has been disclosed for illustrative purposes, those skilled in the art will appreciate that various modifications, additions and substitutions are possible, without departing from the scope and spirit of the invention as described in the accompanying claims.

What is claimed is:

1. A frequency synthesizer comprising:
   a first means for dividing an externally provided reference frequency data signal by a given divide ratio;
   a second means for generating an output signal of variable frequency in response to a frequency control voltage signal;
   a third means for selecting one of multiple moduli in response to a scaling control data signal and for scaling down the output signal of the second means by the selected modulus;
   a fourth means for generating the scaling control data signal in response to an externally provided frequency setting data signal;
   a fifth means for detecting phase difference between an output signal of said first means and the output signal of said third means to generate a phase error signal; and
   a sixth means for filtering the phase error signal to provide it to said second means as the frequency control voltage signal;
   wherein said third means comprises a control logic operating in response to the scaling control signal, a dual modulus prescaler for scaling down the output signal of said second means by either one of two moduli in response to a mode control signal from the control logic, an extender for extending an output signal of said dual modulus prescaler to generate a plurality of output signals under the control of the control logic, and a multiplexer for selecting one of the output signals of said extender responsive to a select signal from the control logic to provide it to said fifth means.

2. The frequency synthesizer according to claim 1, wherein said fifth means comprises a phase-frequency detector for generating charge control signal and discharge control signal, and a charge pump for generating the phase error signal.

3. The frequency synthesizer according to claim 1, wherein said dual modulus prescaler comprises at least one D-type flip-flop having an embedded NAND gate as a front end thereof.

4. The frequency synthesizer according to claim 1, wherein said fourth means comprises a third-order sigma-delta modulator.

5. The frequency synthesizer according to claim 4, wherein an integer part N of a divide ratio of said sigma-delta modulator is set to be either 70 or 71.

6. The frequency synthesizer according to claim 5, wherein the divide ratio of said sigma-delta modulator is set to be N−6 to N+76.

7. The frequency synthesizer according to claim 1, wherein said second means comprises a resonator including varactor diodes and inductors, a differential pair transistors, and AC coupling filter.

8. The frequency synthesizer according to claim 7, wherein said inductors are on-chip spiral inductors.

9. A frequency synthesizer comprising:
   a reference divider for dividing an externally provided reference frequency data signal by a given divide ratio;
   a voltage-controlled oscillator for generating an output signal of variable frequency in response to a frequency control voltage signal;
   a multimodulus prescaler for selecting one of multiple moduli in response a scaling control data signal and for scaling down the output signal of said oscillator by the selected modulus;
   a sigma-delta modulator for generating the scaling control data signal in response to an externally provided frequency setting data signal;
   a phase frequency detector for detecting phase difference between an output signal of said reference divider and the output signal of said, multimodulus prescaler to generate a phase error signal; and
   a loop filter for filtering the phase error signal to provide it to said oscillator as the frequency control voltage signal;
   wherein said multimodulus prescaler comprises a control logic operating in response to the scaling control signal, a dual modulus prescaler for scaling down the output signal of said oscillator by either one of two moduli in response to a mode control signal from the control logic, an extender for extending an output signal of said dual modulus prescaler to generate a plurality of output signals under the control of the control logic, and a multiplexer for selecting one of the output signals of said extender responsive to a select signal from the control logic to provide it to said phase frequency detector.

10. The frequency synthesizer according to claim 9, wherein said phase frequency detector comprises a phase-frequency detector for generating charge control signal and discharge control signal, and a charge pump for generating the phase error signal.

11. The frequency synthesizer according to claim 9, wherein said dual modulus prescaler comprises at least one D-type flip-flop having an embedded NAND gate as a front end thereof.

12. The frequency synthesizer according to claim 9, wherein said sigma-delta modulator comprises a third-order sigma-delta modulator.

13. The frequency synthesizer according to claim 12, wherein an integer part N of a divide ratio of said sigma-delta modulator is set to be either 70 or 71.

14. The frequency synthesizer according to claim 13, wherein the divide ratio of said sigma-delta modulator is set to be N−6 to N+76.

15. The frequency synthesizer according to claim 9, wherein said oscillator comprises a resonator including varactor diodes and inductors, a differential pair transistors, and AC coupling filter.

16. The frequency synthesizer according to claim 15, wherein said inductors are on-chip spiral inductors.

* * * * *